(12) United States Patent
Willemsen et al.

(10) Patent No.: US 8,492,781 B2
(45) Date of Patent: Jul. 23, 2013

(54) LIGHT EMITTING DEVICE

(75) Inventors: Oscar Hendrikus Willemsen, Eindhoven (NL); Michel Cornelis Josephus Marie Vissenberg, Eindhoven (NL); Ramon Pascal Van Gorkom, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 203 days.

(21) Appl. No.: 12/864,519

(22) PCT Filed: Jan. 28, 2009

(86) PCT No.: PCT/IB2009/050343
§ 371 (c)(1),
(2), (4) Date: Jul. 26, 2010

(87) PCT Pub. No.: WO2009/095866
PCT Pub. Date: Aug. 6, 2009

(65) Prior Publication Data
US 2010/0309648 A1    Dec. 9, 2010

(30) Foreign Application Priority Data

Jan. 31, 2008  (EP) .................................. 08150866

(51) Int. Cl.
*H01L 33/00* (2010.01)
(52) U.S. Cl.
USPC ................................ 257/98; 257/89; 257/100
(58) Field of Classification Search
USPC ................................ 257/89, 98, 100, E23.061
See application file for complete search history.

(56) References Cited

U.S. PATENT DOCUMENTS

| 5,739,552 | A | 4/1998 | Kimura et al. |
| 5,898,185 | A | 4/1999 | Bojarczuk, Jr. et al. |
| 5,952,681 | A | 9/1999 | Chen |
| 6,563,139 | B2 | 5/2003 | Hen |
| 6,642,545 | B2 | 11/2003 | Okazaki |
| 7,064,354 | B2 | 6/2006 | Chen |
| 2004/0075395 | A1 | 4/2004 | Antoniadis et al. |
| 2004/0222735 | A1 | 11/2004 | Ragle |
| 2004/0252509 | A1 | 12/2004 | Lin |
| 2007/0120135 | A1* | 5/2007 | Soules et al. ............ 257/98 |

FOREIGN PATENT DOCUMENTS

| EP | 0855751 A2 | 7/1998 |
| WO | 2007034367 A1 | 3/2007 |
| WO | 2008126011 A1 | 10/2008 |

* cited by examiner

*Primary Examiner* — Eugene Lee
*Assistant Examiner* — Elias M Ullah

(57) ABSTRACT

The present invention relates to a light emitting device (1) comprising a stack of a light emitting diode (LED) structure (10) and a light permeable device (20). The light permeable device (20) comprises at least a first and a second section (21, 22), color of light from said first and second section (21, 22) being different from each other. Further, the LED structure (10) comprises at least a first and a second region (11, 12) being individually controllable. The first and second region (11, 12) are associated with the first and second section (21, 22), respectively. The stack further comprises an at least partially reflecting layer (30) arranged such that light from the light permeable device (20), generated in the first and second region (11, 12), is to be mixed within the light emitting device (1).

16 Claims, 6 Drawing Sheets

LIGHT EMITTING DEVICE

FIELD OF THE INVENTION

The present invention relates to the field of light emitting devices, and more particularly to a light emitting device, comprising a stack of a light emitting diode structure and a light permeable device.

BACKGROUND OF THE INVENTION

Use of light emitting diodes (LEDs) is widely spread. For example, LEDs are used as light sources in thin, large area lighting systems, automotive lights, signs and backlight illumination for display devices and more. In many applications, it is desired to be able to control the color point of the light output. This may be achieved by the use of multiple individually controllable LEDs of different colors. In this manner, the amount of, for example, red, green and blue light may be controlled such as to obtain a desired color point of the total light emission from a device, comprising LEDs of different colors.

In WO 2007/034367 A1, there is disclosed a variable color light emitting device, comprising a light emitting diode for emitting light. The diode comprises a plurality of electrically conducting layers, at least one of which being such that lateral current spreading in the diode is limited to form at least two independently electrically addressable segments, for allowing illumination of an optional number of the segments. At least one of the number of segments is provided with a wavelength converter adapted to convert at least part of the light emitted from an associated segment to generate light of a certain primary color. The color variable light emission from the light emitting device is emitted in a direction substantially perpendicular to the plane of the light emitting device (diode). Disadvantageously, the different colors of light from the light emitting device are visible for a viewer looking at the light emitting device.

SUMMARY OF THE INVENTION

A thin large area lighting system (as described in not yet publicly available European patent application no. 07106023.0) comprises a single wave guide 2, in which light is coupled in via square holes (see FIG. 1). The light is coupled out via an out-coupling structure of mirrors that have an angle of approximately 45 degrees with respect to the plane of the waveguide. The out-coupling structure comprises (preferably rectangular) fields with grooves. The orientation 5 of the grooves in one field is orthogonal to the orientation of the grooves in a neighboring field. Because of the fact that the light, in a field of the out-coupling structure closest to an LED in-coupling hole, travels along (i.e. substantially in parallel with) the groves, no (or very limited) out-coupling of the light from that LED will occur in that field. Only in neighboring fields of fields closest to an LED in-coupling hole, where the grooves are orthogonal to the propagation direction of the light from the LED, the light will be reflected (specular reflection) by an out-coupling mirror of the out-coupling structure in such a way that the light exits the wave-guide. In this manner, light is coupled out at a relatively large distance from the source (LED) and, hence, the brightness of the source has been reduced.

However, when viewing into the lighting system, via specular reflection, the source, such as an LED, may be observed (see FIG. 2). For a color variable system of this type, LEDs emitting different colors, such as red, blue and green, may be used. A disadvantage with such a system is that a viewer may see the LEDs of different colors, when looking into the lighting system.

An object of the present invention is to alleviate problems of the prior art.

This object is met by the light emitting device as set forth in the appended independent claim 1. Specific embodiments are defined in the dependent claims.

According to an aspect of the invention, there is provided a light emitting device, comprising a stack of a light emitting diode (LED) structure and a light permeable device. Furthermore, the light permeable device comprises at least a first and a second section, wherein color of light from the first and second section are different from each other. The LED structure comprises at least a first and a second region, wherein light emission from the regions are individually controllable by applying a respective drive signal to each respective region. Moreover, the first and second region are associated with the first and second section, respectively, whereby light generated in the first and second region are coupled out to the first and second section, respectively. The stack further comprises an at least partially reflecting layer arranged such that light from the light permeable device, generated in the first and second region, is to be mixed within the light emitting device.

An idea of the invention is to provide a light emitting device, comprising a light emitting diode (LED) structure (an LED die or a light emitting diode chip), a light permeable device and an at least partially reflecting layer, stacked in aforementioned order. The LED structure comprises regions (or portions), generating light. Each respective light emission (intensity of the light) from each respective region may be individually controlled, whereby the color point of the light emission from the light emitting device may be controlled. The light permeable device comprises sections. At least two sections are associated (or metaphorically coupled to) with a respective region. Hence, there are at least two regions. One section is capable of providing light of a color that is different from the color of the light provided by the other section. The sections and regions are arranged (or located) such that light from at least one section passes at least one other section before exiting the light emitting device. As a result, a viewer, looking into the light emitting device, will not, in general, distinguish individual sections, which are capable of providing light of different colors, since the different colors are mixed within the light emitting device.

The term "section" is to be understood as comprising sections which merely are portions of a homogeneous light permeable device of a certain type as well as sections which are separate parts put (or joined) together such as to form a light permeable device (or assembly).

The number of sections and regions, respectively, may in an embodiment of the light emitting device according to the present invention be three, such as to be able to emit light of three different colors, e.g. red, green and blue. In this manner, the color point of the light from the light emitting device may be controlled by controlling the intensity of the light from each respective region. Thereby, light emission from the associated sections are controlled and mixed before leaving the light emitting device. It is to be understood that the light permeable device comprise any number of sections, as required by a specific application.

Aforementioned at least partially reflecting layer may, preferably, be a (diffuse) reflector. Optionally, the reflecting layer may comprise a diffusion filter or a diffuser.

It is to be understood that a drive signal may be realized in the form of an applied voltage over the LED structure and/or a drive current through the LED structure. It may even be realized by applying a voltage across a certain region (or regions) and driving another region (or regions) with a current. This would, however, make the control circuits more complicated.

In embodiments of the light emitting device according to the present invention, light generated in the regions are coupled out to the sections through a first plane, being generally parallel to the plane of the LED structure. Mixed light comprises a mixture of light of a first color from the first section and light of a second color from the second section (the first color is different from the second color). Mixing of light occurs when light from one section passes through another adjacent section, i.e. mixing is achieved when the direction of light has a component in a direction parallel to the plane of the LED structure. The mixed light may exit (be coupled out from) the light emitting device through a second plane (a side of the light permeable device), which may be arranged at any angle with respect to the plane of the LED structure. This effect is mainly achieved by means of the at least partially reflecting layer. As a result, a substantial amount of the light from the first or second section is passing though the other section before exiting the light emitting device.

In some embodiments of the light emitting device according the invention, the light permeable device is disposed on the LED structure. In this manner, a major portion of the light generated in the LED structure is coupled into the light permeable device. In contrast, in yet other embodiments, there may be additional elements (or layers) between the LED structure and the light permeable device. However, preferably light from the LED structure is still directed into the light permeable device.

In some other embodiments of the light emitting device according to the invention, the at least partially reflecting layer is disposed on the light permeable device. In this manner, mixing of light is achieved within the light emitting device and light may be coupled out of the light emitting device through a side of the light permeable device. In contrast, in still other embodiments, there may be additional elements (or layers) between the light permeable device and the at least partially reflecting layer. However, preferably mixing of light is still achieved within the light emitting device due to the at least partially reflecting layer.

In order to achieve a less direction dependent color point of the mixed light from the light emitting device according to embodiments of the invention, the sections may be positioned (or located) such that mixed light (escaping out of the light emitting device) comprises a controlled mixture of light provided by a fixed number of sections. Consequently, a substantial amount of the light from the light emitting device comprises light from the same number of sections.

From the perspective of a viewer of the light emitting device according to embodiments of the present invention, the light from the two sections appears to come from substantially the same point. In this manner, the appearance of colored shadows is decreased. In addition a viewer looking directly at the light emitting device, or via a specular reflection, may not experience disturbing discolorations of the light emitting device, when the color point of the light emitting device according to embodiments is changed.

In an embodiment of the light emitting device according the present invention, the first and second section are arranged such that light from one of said first and second section is at least partially, preferably substantially completely, transmissible through the other section before exiting said light emitting device. Expressed differently, the sections may be arranged such that light generated in one of said first and second region is passed though the first and second section before exiting the light emitting device. In this manner, mixing of the different colors of the light from the first and second section are achieved within the light emitting device such that the light emitting device has a uniform color distribution when observed from a specific direction.

In other embodiments of the present light emitting device, at least one of the first and second section of the light permeable device is adapted to convert the color of the light from the associated region. It is preferred that the light permeable device is made of an easily structured material, being capable of converting the color of the light passing therethrough, such as a phosphor ceramic material ("lumiramic"), cross-linked silicone or a like. The conversion of the color in the phosphor ceramic material may be based on down-conversion. With down-conversion high energetic (bluish or UV) light is converted into low energetic (preferably visible) light. This can be obtained by means of phosphorescence or fluorescence. However, it may also be possible use a phosphor ceramic material that, by means of up-conversion, converts the color of the light passing therethrough. With (appropriate) up-conversion at least two photons interact in a non-linear process to form at least one photon with visible light. The other photon may or may nor have a wavelength within the visible spectrum.

In another embodiment of the light emitting device according the invention, the light emitting device further comprises a first mirror arranged perpendicularly to the plane of the LED structure and adjacent to the light permeable device. In this manner, light from at least one of the first and second section is at least partially transmissible through the other section before exiting the light emitting device. Preferably, the mirror is arranged such that light from one of the sections is completely transmissible though the other section before exiting the light emitting device.

In further embodiments of the light emitting device, the first mirror is arranged to partially surround the light permeable device and adapted to form fit with the light permeable device. Optimally, the mirror is arranged such that light from one of the sections is at least partially transmissible through another section before leaving the light emitting device.

Furthermore, the light emitting device according to embodiments of the invention may further comprise a second mirror, arranged perpendicularly to the plane of the LED structure and adjacent to the light permeable device. Additionally, the first and second mirror may be arranged to be perpendicularly to each other, optionally in contact with each other. In this embodiment, it is preferred that one of the first and second section is at least partially enclosed by the other section. For example, a square shaped first section may be partially enclosed by an "L"-shaped second section.

As an alternative, the first and second mirror may be arranged to be in parallel with each other. Advantageously, the shape of the sections may be rectangular. Such block shaped sections of, for example a phosphor ceramic material, may be easier to manufacture than more complicated shapes that may be needed for other arrangements of the mirrors.

Moreover, the light emitting device according to still further embodiments of the invention may comprise a third mirror, arranged perpendicularly to the plane of the LED structure, in parallel with the first mirror and adjacent the light permeable device, optionally in contact with said second mirror. For some applications, such as backlighting or general lighting, this may be an advantage, since the cone of light is equal to or less than 180 degrees (2 pi sr). In this manner, a unidirectional side-emitter is created.

In yet other embodiments of the light emitting device according the present invention, one of the first and second section may be arranged to at least partially surround the other section. Preferably, one of the first and second section is completely or substantially surrounded by the other section. Thereby, it is assured that light from one of the first and second section passes though the other section before exiting the light emitting device.

According to embodiments of the light emitting device, the first region may be aligned with said first section. Further, the second region may be aligned with the second section. In this manner, a larger amount of the light from a region may be coupled out to its respective section than when not aligned with its respective section. Most preferably, the size, shape and position (in a plane in parallel with the plane of the LED structure) of a section and its associated region is substantially equal or equal.

In still further embodiments of the light emitting device according the invention, light from the first region may be of a different color that light from the second region. In this manner, the use of a homogeneous light permeable device is enabled. It shall, however, be noted that, even though the light permeable device is formed as one unit (or piece), it comprises at least two sections associated with a respective region of the LED structure, the color of the light from one section being different from the color of light from the other section. In this case, the light permeable device may be a simple non-color converting device. However, the light permeable device may also in other configurations of the light emitting device, comprise a mixture of two different phosphor ceramic materials, in which two different phosphors are sensitive to different wavelengths. Thereby, creating two sections in the light permeable device from which the color of light are different from each other and different from the color of the light generated in the respective region of the LED structure.

In embodiments of the light emitting device according to the present invention, light from the first region may be of the same color as light from the second region. In this case, at least one of the sections of the light permeable device comprises a material that is adapted to convert the color of the light passing therethrough. See discussion above. An advantage may be that it is easier to manufacture an LED in which the individually controllable regions emit the same color.

Furthermore, the light emitting device according to other embodiments of the invention may comprise more than two regions (as mentioned above). For example, LED structure of the light emitting device may comprise three regions. The first region is capable of generating a first color (or wavelength) of light, and the second and third region are capable of generating a second color of light. A first and a second section, disposed on and associated with the first and second region, of the light permeable device may be of the same type (difference in color from the sections relates to difference in color of the light generated in the first and second region). A third section, disposed on and associated with the third region, may be of a different type than the first and second section (which, as stated, may be of the same type) such that color of light from the second and third section are different from each other.

In addition, in yet further embodiments of the light emitting device, any one of the regions may have a polygonal, rectangular, square or circular shape or a combination thereof. Also, any one of the sections may have a polygonal, rectangular, square or circular shape or a combination thereof.

According to another aspect of the invention, there is provided a lighting system comprising at least one light emitting device according to embodiments of the invention and at least one controller for controlling the drive signals applied to each respective region.

The present invention may be applied to luminaries, spotlights and downlights. In spotlight applications, it may be advantageous to use the compact color mixing light emitting device according to the embodiments of the present invention, which have been indicated above. The preferred applications of the light emitting device is, however, for use with thin, flat, large-area lighting systems.

Further features of, and advantages with, the present invention will become apparent when studying the appended claims and the following description. Those skilled in the art realize that different features of the present invention may be combined to create embodiments other than those described in the following, without departing from the scope of the present invention.

BRIEF DESCRIPTION OF THE DRAWINGS

The various aspects of the invention, including its particular features and advantages, will be readily understood from the following detailed description and the accompanying drawings, in which.

DETAILED DESCRIPTION OF EMBODIMENTS

Figure 1:
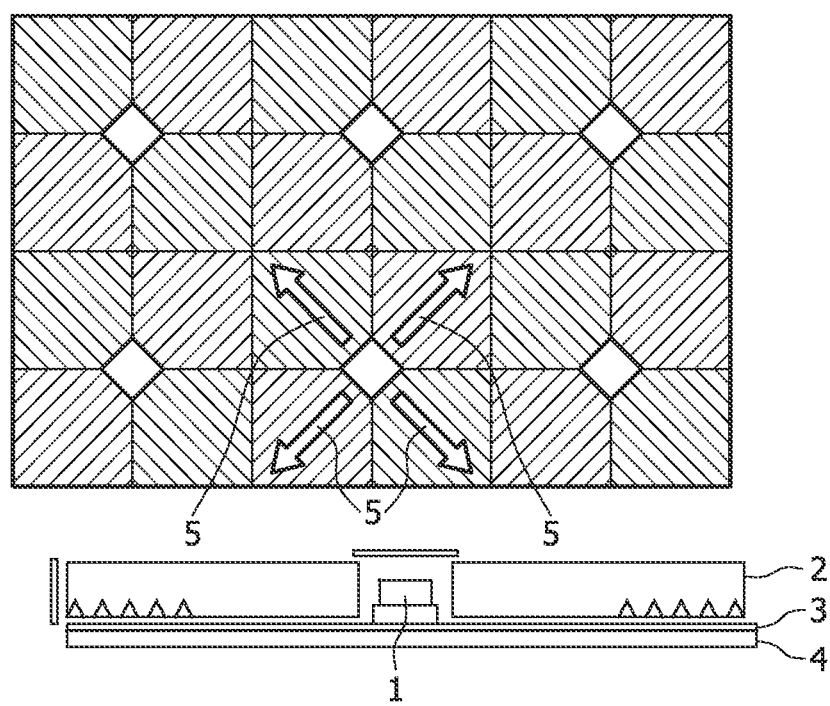
FIG. 1 shows a portion of a prior art lighting system in a top view (top) and a cross-sectional view (bottom)

Throughout the following description similar reference numerals have been used to denote similar elements, parts, items or features, when applicable.

Figure 3:
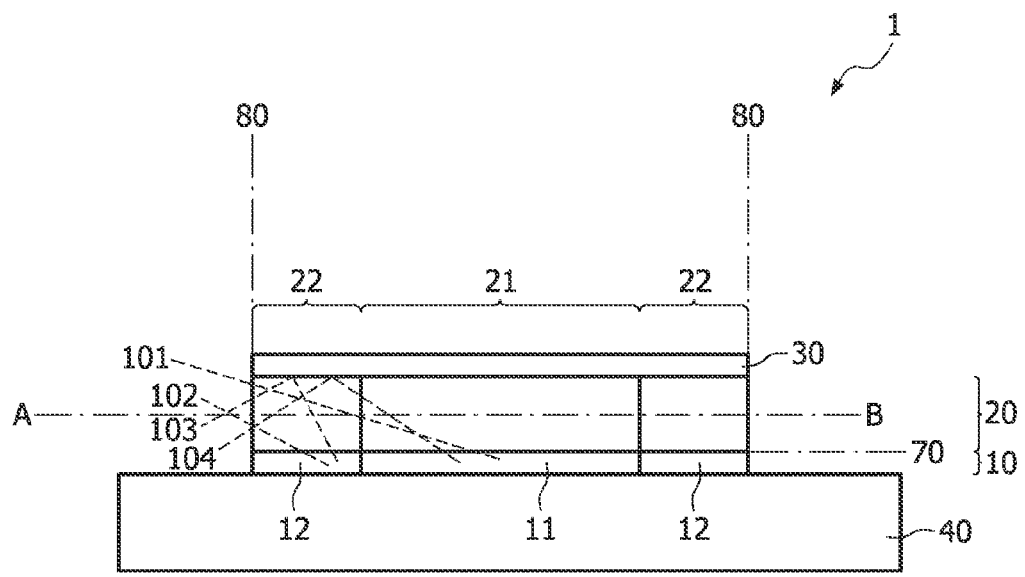
FIG. 3 shows the light emitting device according to an embodiment of the invention in a cross-sectional side view.

In FIG. 3, there is illustrated an example of the light emitting device according to an embodiment of the invention. The light emitting device 1 comprises a light emitting diode die 10 (LED die or LED structure), a phosphor ceramic tile 20 comprising two segments (or sections) 21, 22 and a reflector 30, disposed on each other in this order. Further, the light emitting device 1 is disposed on a substrate 40. The LED die 10 comprises two zones 11, 12 (or regions), which are individually controllable by application of a respective voltage to each respective zone 11, 12. In addition, each zone corresponds to and is aligned with a respective phosphor ceramic segment. The segments are of different types such as to be able to convert the color of light to two different colors. However, in other embodiments the segments may be of the same type and the difference in color may depend on difference in wavelength in the light emitted from the different zones (or regions) 11, 12. It is also to be noted that, for the sake of simplicity of FIG. 3, connection wires to and from the LED die are not shown. Generally, it is preferred that the segment 21 of the phosphor ceramic tile emits the longest (most red-shifted) wavelength of the segments 21, 22. In this manner, the reabsorption of light in the other segment 22 is minimized.

In a further example (not shown), the light emitting device of FIG. 3 comprises an additional reflector means, arranged along the periphery of the phosphor ceramic tile 20 and at an angle of (substantially) 45 degrees to an normal of the LED die 10, such as to reflect light emitted from the sides of the phosphor ceramic tile 20 in a direction essentially parallel with the normal of the LED die 10. It is preferred that the phosphor ceramic tile has an inclined surface such as to match the tilted reflector means, enclosing the phosphor ceramic tile. By using other angles than 45 degrees, it may be possible to direct the light in other directions than in a direction essentially parallel with the normal of the LED die 10.

The size and position of the sections and regions may be adjusted such as to be optimized for a specific application. The desired light flux for any desired application determines the size and position of the sections and regions, which may be tailored accordingly.

When applying a voltage to the respective zones of the LED die, light is generated in each respective zone 11, 12. The light from each respective zone 11, 12 is coupled out (through a first plane 70, being generally in parallel with the plane of the LED die) to the corresponding phosphor ceramic segment 21, 22. Light from segment 21 will pass through segment 22 before exiting (though a second plane 80, being generally perpendicular to the plane of the LED die) the light emitting device 1 such that a viewer will observe a mixture of the light from segment 21 and 22. Two light rays 101, 104, generated in region 11, indicate light from the segment (or section) 21 and two light rays 102 and 103, generated in region 12, indicate light from segment (or section) 22. As may be seen from FIG. 3, a viewer of the light emitting device may observe rays 101 and 102, which is to be interpreted as a mixture of light from segments 21 and 22. At a different location, a viewer may similarly observe light rays 103, 104, which is to be interpreted as a mixture of light from segments 21 and 22.

In FIGS. 4 and 5 and FIGS. 7 to 11, the reflecting layer is not shown such as to be able to more clearly display the sections (or segments) of the light emitting device. Additionally, it shall be understood that in each of FIGS. 4 and 5 and FIGS. 7 to 11, each segment displayed is associated with an underlying region of the LED die, as shown in FIG. 3.

Figure 4:
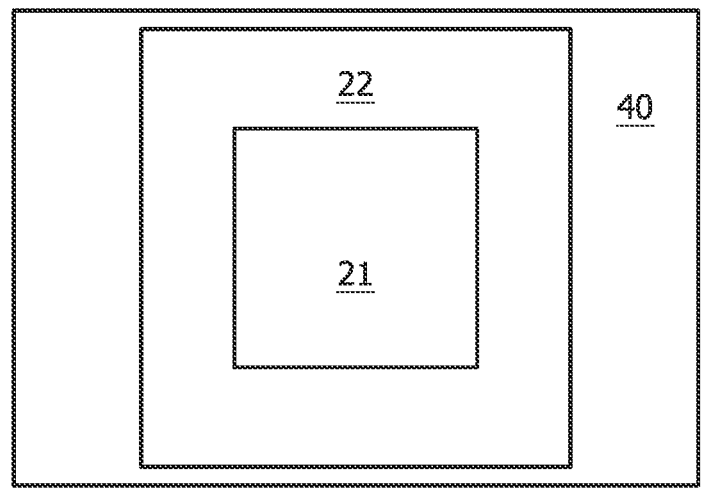
FIG. 4 shows a cross-sectional top view of the light emitting device in FIG. 3, taken along the line A-B.

Referring to FIG. 4, there is shown a cross-sectional, top view of the light emitting device 1 in FIG. 3 along the line A-B. From FIG. 4, it can be seen that, in this exemplifying configuration, segment 22 completely surrounds segment 21. Hence, no light from segment 21 is allowed to escape out of the light emitting device without passing through segment 22. In this manner, light from segment 21 and segment 22 are mixed before exiting the light emitting device.

Figure 5:
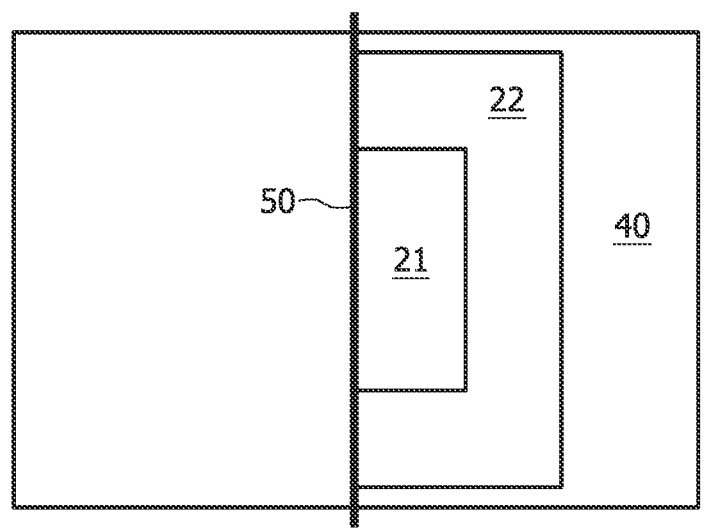
FIG. 5 shows a cross-sectional, top view of a light emitting device according another embodiment of the present invention.

FIG. 5 indicates another exemplifying light emitting device according to an embodiment of the invention. In this embodiment a rectangular phosphor ceramic segment ("lumiramic") 21 is disposed on a substrate 40. Another phosphor ceramic segment 22 semi-surrounds segment 21, creating a phosphor ceramic assembly. Additionally, the light emitting device is equipped with a mirror 50. The mirror 50 is arranged along a side of the phosphor ceramic assembly, comprising both segment 21 and 22. The mirror 50 is located such as to guide light from segment 21 back into the segments such that is passes through segment 22 and mixes with the light in segment 22 within the phosphor ceramic tile. In this manner, the mirror 50 prevents a viewer from viewing the different segments 21, 22 along one of the sides of the phosphor ceramic assembly.

Figure 2:
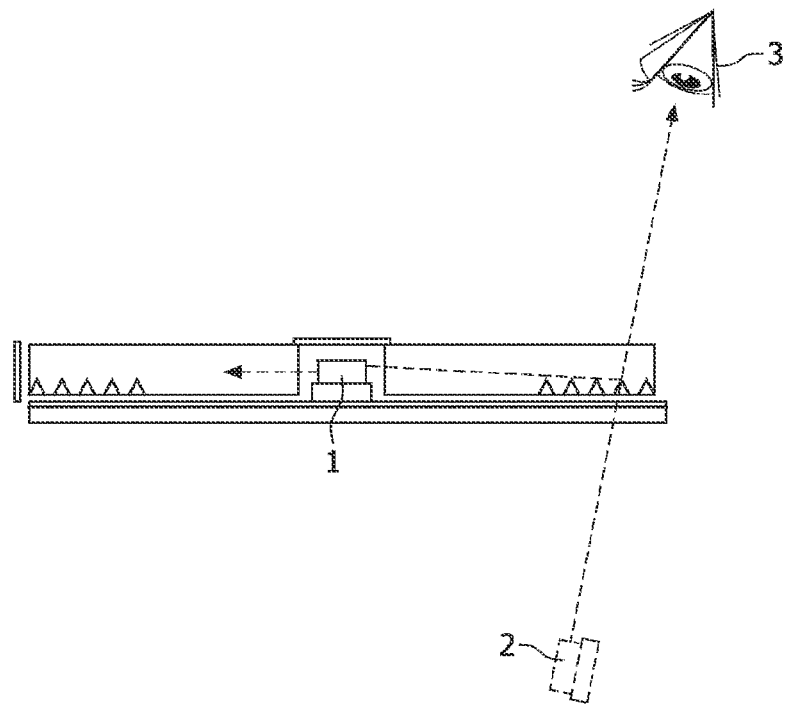
FIG. 2 shows another cross-sectional view of a portion of the lighting system in FIG. 1.
Figure 6:
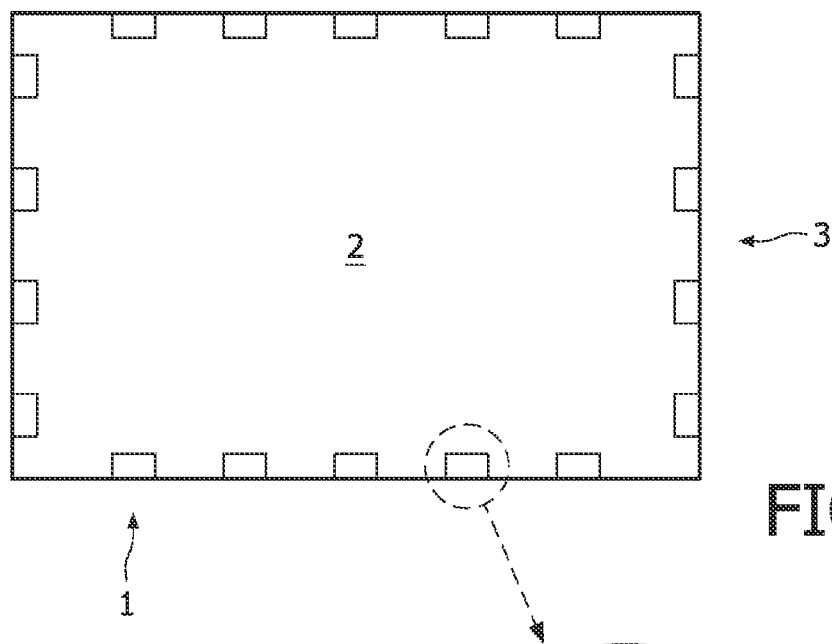
FIG. 6 shows a cross-sectional, top view of a lighting system in which the light emitting device according to FIG. 5 is used.

With reference to FIG. 6, there is shown a lighting system 3, comprising a plurality of light emitting devices 1 according to FIG. 5. The light emitting devices 1 in FIG. 6 are arranged along the sides of a flat, thin, large-area light guide 2. For the case that the lighting system according to FIG. 6 is based on the lighting system according to FIGS. 1 and 2, the light emitting devices according to the invention will prevent a viewer from observing different colors when looking into the light sources 1 (light emitting devices according FIG. 5.)

Figure 7:
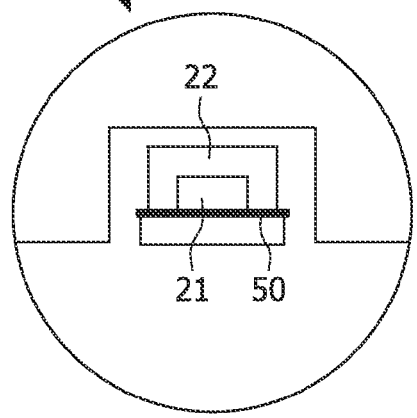
FIG. 7 shows an enlarged, cross-sectional, top view of one of the light emitting devices 1 in FIG. 6.

In FIG. 7, there is demonstrated an enlarged view of the light emitting device according to FIG. 5. As can be seen from FIG. 7, the mirror (50) is facing the center of the light guide 2 in FIG. 6. Thereby, light is effectively transmitted to the light guide.

Figure 8:
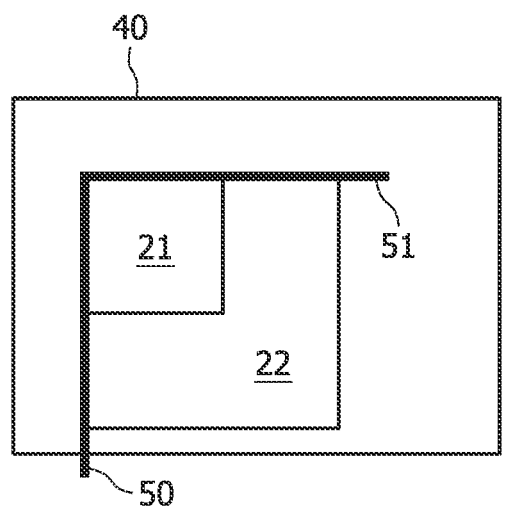
FIG. 8 shows a cross-sectional, top view of a light emitting device according a further embodiment of the present invention.

In FIG. 8, there is shown a further example according to embodiments of the light emitting device. The light emitting device comprises a square-shaped segment (or section) 21 and a segment (or section) 22 in the form of an inverted "L". The segment 22 is shaped such as to cover two sides of the square-shaped segment 21. Further, the light emitting device comprises a first and a second mirror 50 and 51. The first and second mirror 50 and 51 are arranged along the first and second segment and generally perpendicularly to each other. The light emitting device according FIG. 8 is suitable for positioning in the corners of the lighting system according to FIG. 6.

Figure 9:
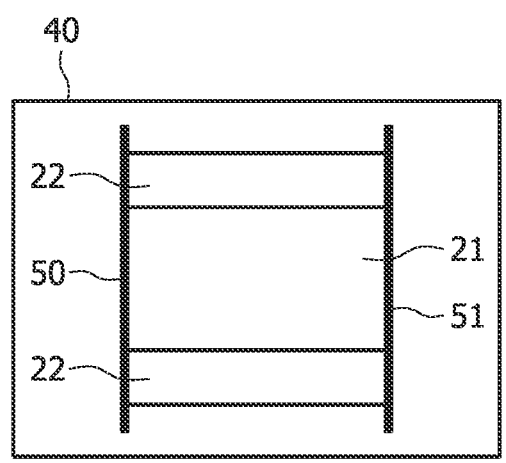
FIG. 9 shows a cross-sectional, top view of a light emitting device according yet another embodiment of the present invention.

In an alternative embodiment of the light emitting device according to the present invention, as shown in FIG. 9, a rectangular segment 21 is located between two stripes of a segment 22. Further, the segment 21 and segments 22 are positioned between two mirrors 50 and 51 (reflective layers or diffusers). In this manner, the mirrors 50, 51 assure that light from segment 21 is mixed with light from segment 22.

Figure 10:
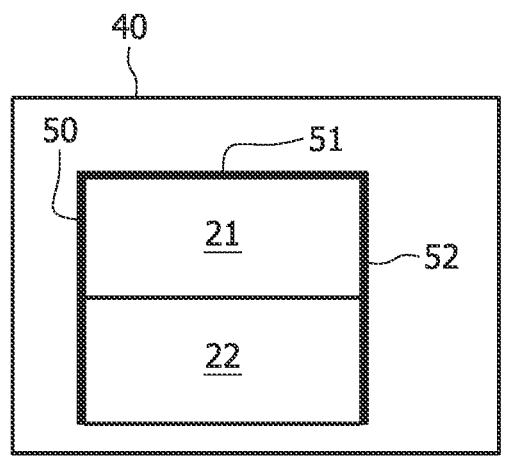
FIG. 10 shows a cross-sectional, top view of a light emitting device according a still further embodiment of the present invention.

Referring to FIG. 10, there is illustrated a further light emitting device comprising two rectangular segments (or sections) 21 and 22, the segments being arranged adjacent to each other, and three mirrors 50, 51 and 52. The mirrors are arrange perpendicularly to the plane of the LED die (not shown, see FIG. 3). A first and second mirror 50, 52 are arranged along opposing, peripheral sides of the light permeable structure (e.g. a phosphor ceramic assembly), comprising segment 21 and 22. A third mirror 51 is arranged along a peripheral side of segment 21. By way of surrounding the two segments with mirrors as described above, light from segment 21 passes through and mixes with light from segment 22 before exiting the light emitting device.

Figure 11:
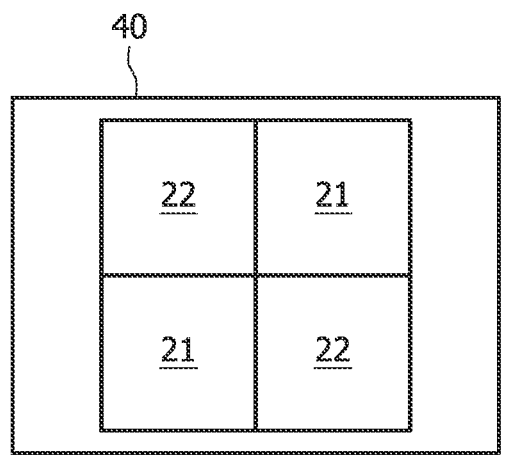
FIG. 11 shows a cross-sectional, top view of a light emitting device according still another embodiment of the present invention.

In FIG. 11, there is presented a less efficient embodiment of the light emitting device according to the present invention. The light emitting device comprises two segments 21 that are of the same type and two segments 22 that are of the same type, but different from the type of segments 21. The four segments are of square-shape and are arranged in a chessboard-style. In this example, there is no segment from which light has to pass another segment before exiting the light emitting device. However, from the positioning of the segments as demonstrated in FIG. 11, it may be concluded that when a viewer observes the light emitting device from most directions, there will be two segments in line with the viewing direction. Hence, light from the segment further away from the viewer will be mixed with light from the segment closer to the viewer. Accordingly, light mixing is achieved. This embodiment of the light emitting device may be improved by placing a diffuser at a distance from the segments 21 and 22.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

The invention claimed is:

1. A light emitting device, comprising:
a light emitting diode (LED) structure,
a light permeable device, and
an at least partially reflecting layer, wherein:
said light permeable device is disposed between said LED structure and said at least partially reflecting layer,
said light permeable device comprises at least a first and a second section, color of light from said first and second section being different from each other,
said LED structure comprises at least a first and a second region, light emission from, said regions being individually controllable by applying a respective drive signal to each respective region,
said first and second region are associated with said first and second section, respectively, wherein light generated in said first and second region are coupled out to said first and second section, respectively, and
at least partially reflecting layer is disposed over a top surface of the LED structure and arranged such that light from said light permeable device, generated in said first and second region, is mixed within said light emitting device.

2. The light emitting device according to claim 1, wherein said first and second section are arranged such that light from one of said first and second section is at least partially transmissible through the other section of said first and second section before exiting said light emitting device.

3. The light emitting device according to claim 1, wherein at least one of said first and second section is adapted to convert the color of the light from the region that is associated with said at least one of said first and second section.

4. The light emitting device according to claim 1, wherein at least one of said first and second section comprises a phosphor ceramic material.

5. The light emitting device according to claim 1, wherein said light emitting device further comprises a first mirror arranged perpendicularly to the plane of said LED structure and adjacent to said light permeable device, such that light from at least one of said first and second section is at least partially transmissible through the other section before exiting said light emitting device.

6. The light emitting device according to claim 5, wherein said first mirror is arranged to partially surround said light permeable device and adapted to form fit with said light permeable device.

7. The light emitting device according to claim 5, wherein said light emitting device further comprises a second mirror, arranged perpendicularly to the plane of said LED structure and adjacent to said light permeable device.

8. The light emitting device according to claim 7, wherein said first and second mirror are perpendicular to each other and in contact with each other.

9. The light emitting device according to claim 8, wherein said light emitting device further comprises a third mirror, arranged perpendicularly to the plane of said LED structure, in parallel with said first mirror and adjacent said light permeable device.

10. The light emitting device according to claim 1, wherein one of said first and second section is arranged to substantially surround the other section.

11. The light emitting device according to claim 1, wherein said first region is aligned with said first section.

12. The light emitting device according to claim 1, wherein said second region is aligned with said second section.

13. The light emitting device according to claim 1, wherein light from said first region is of a different color that light from said second region.

14. A lighting system comprising at least one light emitting device according to claim 1 and at least one controller for controlling the drive signals applied to each respective region.

15. The light emitting device according to claim 1, wherein said first and second sections comprise phosphor materials, and said first and second sections comprise different types of phosphor materials.

16. The light emitting device according to claim 1, wherein said first and second regions emit different peak wavelengths of light.

* * * * *